(12) United States Patent
Uchida

(10) Patent No.: US 9,777,946 B2
(45) Date of Patent: Oct. 3, 2017

(54) LIQUID HEATING METHOD, LIQUID HEATING APPARATUS, AND HEATED LIQUID SUPPLYING APPARATUS

(75) Inventor: Minoru Uchida, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 811 days.

(21) Appl. No.: 14/007,026

(22) PCT Filed: Feb. 24, 2012

(86) PCT No.: PCT/JP2012/054524
§ 371 (c)(1),
(2), (4) Date: Sep. 24, 2013

(87) PCT Pub. No.: WO2012/132680
PCT Pub. Date: Oct. 4, 2012

(65) Prior Publication Data
US 2014/0029924 A1     Jan. 30, 2014

(30) Foreign Application Priority Data

Mar. 25, 2011   (JP) .................................. 2011-067342

(51) Int. Cl.
| | |
|---|---|
| F24H 1/10 | (2006.01) |
| F24H 1/12 | (2006.01) |
| F24H 9/20 | (2006.01) |
| H01L 21/67 | (2006.01) |

(52) U.S. Cl.
CPC ........... *F24H 1/121* (2013.01); *F24H 9/2028* (2013.01); *H01L 21/67017* (2013.01); *B08B 2203/007* (2013.01)

(58) Field of Classification Search
None
See application file for complete search history.

(56) References Cited

U.S. PATENT DOCUMENTS

| | | | |
|---|---|---|---|
| 2001/0003555 A1 | 6/2001 | Koizumi et al. | |
| 2011/0262120 A1 | 10/2011 | Uchida et al. | |

FOREIGN PATENT DOCUMENTS

| | | |
|---|---|---|
| CN | 102138045 | 7/2011 |
| EP | 2 325 574 | 5/2011 |
| JP | 04-136455 | 12/1992 |
| JP | 07-026652 | 5/1995 |
| JP | 2006-317122 | 11/2006 |
| JP | 2010-060147 | 3/2010 |
| KR | 10-2011-0053429 | 5/2011 |
| TW | 423979 | 3/2001 |
| TW | 201015032 | 4/2010 |
| WO | 2010023959 | 3/2010 |

*Primary Examiner* — Thor Campbell
(74) *Attorney, Agent, or Firm* — Scarinci & Hollenbeck

(57) ABSTRACT

A liquid heating method and apparatus including a heat device 7 having a flow passage member forming a tubular flow passage for passing a sulfuric acid solution, a heater arranged on an outside of at least one of opposing flow passage surfaces of the tubular flow passage, a liquid draining line 10, an atmosphere opening line 12, valves 11 and 13, a liquid draining mechanism for draining the sulfuric acid solution heated at least in a heat receiving area between the opposing liquid flow passage surfaces of the tubular flow passage, a flow meter 6 for measuring a flow rate of the sulfuric acid solution, and a control unit 14 responsive to the flow meter 6 for determining a defective liquid flow in the tubular flow passage and for draining the sulfuric acid solution using the liquid draining mechanism.

5 Claims, 6 Drawing Sheets

(a)

(b)

(c)

LIQUID HEATING METHOD, LIQUID HEATING APPARATUS, AND HEATED LIQUID SUPPLYING APPARATUS

TECHNICAL FIELD

The present invention relates to a liquid heating method and a liquid heating apparatus capable of rapidly heating a liquid, and a heated liquid supplying apparatus including the liquid heating apparatus.

BACKGROUND ART

A solution of sulfuric acid and the like are often heated to use at a high temperature as a cleaning liquid in the resist stripping process in the semiconductor manufacturing. Particularly, in a process of heating a sulfuric acid solution containing persulfuric acid (peroxodisulfuric acid and peroxomonosulfuric acid are collectively referred to as persulfuric acid.) obtained by electrolyzing a sulfuric acid solution to obtain high oxidizing property, it is desired to rapidly heat the sulfuric acid solution containing persulfuric acid in a few seconds to supply the solution to the resist stripping process. Patent Document 1 proposes a liquid heating device capable of heating the sulfuric acid solution containing persulfuric acid in a short period to a high temperature.

When the sulfuric acid solution containing persulfuric acid is heated, a residence time of the sulfuric acid solution containing persulfuric acid in the heating device is preferably reduced by reducing a thickness of a heating liquid flow passage to rapidly heat the sulfuric acid solution containing persulfuric acid. Moreover, the persulfuric acid is preferably prevented from decomposing by itself due to a high temperature near a heat conduction surface by heating not with heat transfer by conduction by means of a heat transfer plate and convection, but with radiant heat.

CITATION LIST

Patent Document

Patent Document 1: Japanese Unexamined Patent Application Publication No. 2010-060147

DISCLOSURE OF THE INVENTION

Problem to be Solved by the Invention

By the way, while the sulfuric acid solution containing persulfuric acid is supplied to the heating liquid flow passage of a rapid heating device, liquid contact surfaces of members constructing the heating liquid flow passage are continuously cooled by the liquid flow. However, even if the heating liquid flow passage is constructed by members as thin as approximately 1 mm, heat is accumulated by the radiant heat outside the liquid contact surfaces, and the outside may reach a high temperature equal to or higher than 1000° C. Further, the portions at the high temperature outside the heat contact surfaces are heat-insulated due to a structure of the heating device, and are not rapidly cooled.

If a power interruption occurs during the operation of the rapid heating device, operations of a pump, the rapid heating device, and the like stop, and the liquid flow with the rapid heating device stops. Then, the liquid at the liquid contact surfaces is quickly heated by the heat conduction, and the radiant heat is large immediately after the stop, a bulk portion of the liquid is also quickly heated, and the liquid resident in the rapid heating device is heated. The rapid heating device is narrow in the heating liquid flow passage, and is small in a liquid holdup quantity inside, and the liquid temperature thus drastically increases by the heating, and boils in a few or a few tens of seconds. For example, the boiling point of a sulfuric acid solution of 90% by mass in sulfuric acid concentration is 264° C., and the sulfuric acid solution may easily boil.

If the entire liquid is vaporized, the liquid becomes overheated vapor, and the temperature increases further. A body of the heating device is generally made of quartz, and a pipe made of fluororesin such as tetrafluoroethylene-perfluoroalkylvinylether copolymer (PFA) is often used as a pipe on outlet side of the heating device. It is known that the pipe made of fluororesin is eroded at 260 to 300° C. Thus, when the continuous supply of the liquid to the rapid heating device is stopped, the overheated vapor of the liquid can flow out to the outlet side pipe, can erode the pipe, and can spout to the outside.

Though a description is given of the trouble in power interruption, the same problem can occur in the following cases.

A decrease in liquid feed quantity, or stop of the liquid feed due to a failure of the pump.

Stop of the liquid feed due to interruption of power supply to the pump, and resulting inactivity of an electromagnetic valve in the pump.

Stop of liquid feed due to an interruption of air supply to an air pump as a result of failure of the air compressor, and incapability of drive of the pump.

Stop of liquid feed due to stop of the drive of the pump due to a human error such as a control logic for the pump.

The rapid heating device remains in operation in these cases, which is different from the power interruption, and the time until the liquid boils, and the overheated vapor is generated thus becomes even shorter.

It should be noted that the same problem can occur when the operation of the rapid heating device is stopped. However, after the operation of the rapid heating device is stopped, the operation can be safely stopped without boiling the liquid by continuing the liquid flow for a while, and stopping the liquid flow after the rapid heating device is sufficiently cooled in this case.

As described above, it is necessary to avoid the boiling of the liquid and the resulting generation of the overheated vapor upon the power interruption, the trouble in the pump, and generation of other defective liquid flow in the rapid heating device.

A technology relating to the rapid heating device for liquid has been widely known as a technology relating to the water heater and the like. However, the problem of the present invention is not known. A description will now be given of a reason for that while a household gas instantaneous water heater is exemplified.

FIG. 6 shows a structure of a general household gas instantaneous water heater.

An internal pipe 101 is arranged so as to meander from a bottom to a top in the water heater body 100. A water supply pipe 102 is connected to a lower end of the internal pipe 101 so that water can be supplied from the outside. Moreover, a hot water supply pipe 103 for feeding the boiled water is connected via a valve 104 to an upper end of the internal pipe 101 for feeding the hot water to the outside.

A gas burner 105 is installed at a bottom portion inside the water heater body 100. The inside of the water heater body 100 forms a gas flow passage 100a through which a burned gas by the gas burner 105 flows. An exhaust opening 100b for exhausting the gas burnt by the gas burner 105 is provided on a top plate portion of the water heater body 100.

When the gas instantaneous water heater shown in FIG. 6 is used to heat the water at 25° C. to hot water at 50° C., the burning temperature of the gas at the gas burner 105 is approximately 800° C., heat is collected by the internal pipe 101 until the temperature decreases to 200° C. while the burnt gas is flowing upward in the gas flow passage 100*a*, and the burnt gas is exhausted via the exhaust opening 100*b* to the outside of the water heater body 100.

Moreover, a supply speed of the water by the water supply pipe 102 is approximately 10 L (liter)/min (the supply speed of the water is 8 L/min if the water is caused to flow through a pipe having a diameter of 13 mm at a flow speed of 1 m/sec). If a period required by the water for passing through the water heater body 100 is 10 seconds, the water holding quantity is 1.67 L in the water heater body 100.

Moreover, there is provided such a structure that the burning of the gas at the gas burner 105 stops at a moment when the supply of the water stops, namely when the valve 104 is closed. On this occasion, the quantity of the water trapped in the water heater body 100 is 1.67 L, and an average temperature thereof is (25+50)/2=37.5° C. A heat quantity required for the water to rise to 100° C., and a heat quantity required for the entire quantity of the water to boil are calculated by the following equations.

Heat quantity required for heating to 100° C.:

$$1.67\ kg \times (100-37.5)°\ C. \times 1\ kcal/kg/°\ C. = 103\ kcal$$

Heat quantity required for boiling:

$$(639-37.5)\ kcal/kg \times 1.67\ kg = 996\ kcal$$

The temperature of the internal pipe 101 during the gas burning does not greatly exceed 50° C. due to the contact with the water. Moreover, it is assumed that burning portions in the water heater such as the gas burner 105 and the gas flow passage 100*a* for leading the burnt gas are at 500° C., which is an average temperature of 800° C. and 200° C. Further, if it is assumed that the weight of the burning portions is approximately 0.5 kg, the heat quantity held by the burning portions is calculated as:

$$0.5\ kg \times (500-100)°\ C. \times 0.13\ kcal/kg/°\ C. = 26\ kcal$$

It should be noted that 0.13 kcal/kg/° C. represents the specific heat of the stainless steel.

The value 26 kcal of the heat quantity held by the burning portions acquired by the above-mentioned calculation is sufficiently small compared with the value 103 kcal of the heat quantity required by the water trapped in the water heater body 100 at the moment when the supply of the water stops to reach 100° C., and the value 996 kcal of the heat quantity required by the entire water thereof to boil. Thus, heat to boil the water trapped in the water heater body 100 is not supplied from the burning portions to the water. As a result, even if the water inside the water heater body 100 is not drained, the supply of the water can be safely stopped without leading to boiling in the household gas instantaneous water heater.

In contrast, if the sulfuric acid solution of 90% by mass in sulfuric acid concentration supplied at a supply speed of 1.5 L/min is heated from 100° C. to 200° C. in five seconds in the rapid heating device described in Patent Document 1, a quantity of the sulfuric acid solution residing in the heating device upon the stop of the supply of the sulfuric acid solution is 125 mL, and the average temperature is 150° C. The boiling point of the sulfuric acid solution of 90% by mass in sulfuric acid concentration is 265° C., and a heat quantity required for the liquid to reach the boiling point is obtained by multiplying a difference in enthalpy 51.2 kcal/kg between 150° C. and 265° C.:

$$0.125\ L \times 1.68\ kg/L \times 51.2\ kcal/kg = 10.8\ kcal$$

It should be noted that 1.68 kg/L represents a specific gravity of the sulfuric acid solution of 90% by mass in sulfuric acid concentration at 150° C.

The mass of the quartz portions including the heating heater is approximately 3 kg, and the temperature of a heater filament is approximately 2400° C. If a mass of quartz of a portion which is not directly in contact with the liquid flow passage out of an internal structure of the quartz is approximately 1 kg, and an average temperature is 1000° C., the held heat quantity of the portion is calculated as:

$$1\ kg \times (1000-265)°\ C. \times 0.18\ kcal/kg/°\ C. = 132\ kcal$$

It should be noted that 0.18 kcal/kg/° C. represents the specific heat of the quartz.

As apparent from the above-mentioned calculation, in the rapid heating device of such a type as described in Patent Document 1, the heat quantity held by the heating device is overwhelmingly larger than the heat quantity required by the sulfuric solution to reach the boiling point. As a result, if the supply of the sulfuric acid solution stops, the sulfuric acid solution residing in the heating device easily boils.

If the heat quantity required for the liquid residing in the heating device to boil and the heat quantity held by the heating device are compared with each other, and the latter is larger than the former in the rapid heating device as described above, such a problem that the liquid residing in the heating device boils, and the over-heated vapor is generated can occur. Thus, if the supply of the liquid is stopped, it is necessary to drain the liquid in the heating device to prevent the liquid from boiling in this case.

In a conventional rapid heating device such as a household gas instantaneous water heater and a device referred to as instantaneous heating device, a heat quantity required for a liquid residing in the heating device to boil is generally larger than a heat quantity held by the heating device. As a result, the problem of the present invention does not occur, and a safety mechanism for preventing the liquid from boiling upon the generation of defective liquid flow will not be required.

On the other hand, the rapid heating device subject to the present invention is small in quantity of the liquid residing in the heating device, and heats the liquid in the small quantity in a short period, a magnitude of increase in temperature of the liquid is large, and the exit temperature of the heating device is relatively close to the boiling temperature of the liquid. The problem of the boiling upon the generation of the defective liquid flow of the liquid occurs in this type of rapid heating device, and a safety mechanism for preventing the liquid from boiling is thus required.

The present invention is devised in view of the above situation, and has an object to provide a liquid heating method, a liquid heating apparatus, and a heated liquid supplying apparatus including the liquid heating apparatus which can prevent a liquid from boiling, thereby avoiding the generation of the overheated vapor even if a defective liquid flow is generated in the heating liquid flow passage.

Means for Solving Problem

According to a first aspect of the invention, there is provided a liquid heating method for heating a liquid flowing in a heat receiving area of a heating liquid flow passage by means of a heater arranged outside the heating liquid flow passage while flowing the liquid in the heating liquid flow passage, wherein during the heating by the heater or when remaining heat in a portion other than the liquid, caused by the heating, at least exceeding the boiling point of the liquid is left after the heater is stopped, the liquid at least heated in the heat receiving area by the heater or received the remaining heat by the heater is extracted to the outside of the heating liquid flow passage in response to a defective liquid flow in the heating liquid flow passage.

According to a second aspect of the invention, in the liquid heating method according to the first aspect of the invention, the defective liquid flow is a stop of the liquid flow, or a decrease in a flow rate to a value equal to or lower than a predetermined value during the liquid flow.

According to a third aspect of the invention, in the liquid heating method according to the first or second aspect of the invention, a depth of the heating liquid flow passage with respect to the heater is equal to or less than 10 mm, and the liquid passes the heat receiving area in 0.5 to 10 seconds by the liquid flow.

According to a fourth aspect of the invention, in the liquid heating method according to any one of the first to third aspects of the invention, the liquid is a sulfuric acid solution having 65 to 96% by mass in sulfuric acid concentration, and the heater heats the sulfuric acid solution to 140 to 220° C.

According to a fifth aspect of the invention, there is provided a liquid heating apparatus including a heating unit having a flow passage member forming a heating liquid flow passage through which a liquid flows, and a heater arranged outside the heating liquid flow passage, including:

a liquid draining mechanism for draining the liquid heated at least in a heat receiving area of the heating liquid flow passage to the outside of the heating liquid flow passage, a monitoring unit for monitoring a supply state of the liquid supplied to the heating liquid flow passage, and a liquid draining control unit for providing control of receiving a monitoring result by the monitoring unit, determining a defective liquid flow in the heating liquid flow passage based on the monitoring result, and draining the liquid by the liquid draining mechanism in response to the defective liquid flow.

According to a sixth aspect of the invention, in the liquid heating apparatus according to the fifth aspect of the invention, the monitoring unit monitors a supply state of the liquid supplied to the heating liquid flow passage, and a heating state of the heating unit, and the liquid draining control unit provides control of receiving the monitoring result by the monitoring unit, determining the defective liquid flow in the heating liquid flow passage and heating continuation by the heating unit based on the monitoring result, and draining the liquid by the liquid draining mechanism in response to the heating continuation and the defective liquid flow.

According to a seventh aspect of the invention, in the liquid heating apparatus according to the fifth or sixth aspect of the invention, the liquid draining control unit provides control of carrying out the draining of the liquid by the liquid draining mechanism, and control of stopping a power supply to the heating unit.

According to an eighth aspect of the invention, the liquid heating apparatus according to any one of the fifth to seventh aspects of the invention includes an uninterruptible power supply capable of supplying at least the liquid draining control unit with electric power.

According to a ninth aspect of the invention, in the liquid heating apparatus according to any one of the fifth to eighth aspects, the heating liquid flow passage is formed approximately vertically, the draining mechanism includes an atmosphere opening line connecting with a top side of the heating liquid flow passage, a liquid draining line connecting with a bottom side of the heating liquid flow passage, a first valve provided on the atmosphere opening line, and a second valve provided on the liquid draining line, and the liquid draining control unit provides control of bringing the first valve and the second valve from a closed state to an open state when the liquid is drained.

According to a tenth aspect of the invention, in the liquid heating apparatus according to the ninth aspect of the invention, the liquid draining control unit brings the first valve and the second valve into the closed state upon the liquid flow other than the defective liquid flow.

According to an eleventh aspect of the invention, in the liquid heating apparatus according to any one of the fifth to tenth aspects of the invention, the monitoring unit includes a flow meter for measuring a flow rate of the liquid supplied to the heating liquid flow passage.

According to a twelfth aspect of the invention, in the liquid heating apparatus according to any one of the fifth to tenth aspects of the invention, the monitoring unit detects an operation state of a pump for supplying the heating liquid flow passage with the liquid.

According to a thirteenth aspect of the invention, there is provided a liquid heating apparatus including a heating unit having a flow passage member forming a heating liquid flow passage through which a liquid flows, and a heater arranged outside the heating liquid flow passage, including a liquid draining mechanism for draining the liquid heated at least in a heat receiving area of the heating liquid flow passage to the outside of the heating liquid flow passage, wherein the liquid draining mechanism carries out an operation of draining the liquid to the outside of the heating liquid flow passage in response to stop of power supply upon a power interruption abruptly stopping a power supply to a pump for supplying the heating liquid flow passage with the liquid.

According to a fourteenth aspect of the invention, in the liquid heating apparatus according to the thirteenth aspect of the invention, the heating liquid flow passage is formed approximately vertically, the draining mechanism includes an atmosphere opening line connecting with a top side of the heating liquid flow passage, a liquid draining line connecting with a bottom side of the heating liquid flow passage, a first valve provided on the atmosphere opening line, and a second valve provided on the liquid draining line, and each of the first valve and the second valve includes a valve actuator provided with a failsafe mechanism, the respective valve actuators operating to bring the first valve and the second valve from a closed state to an open state upon a power interruption abruptly stopping a power supply to a pump for supplying the heating liquid flow passage with the liquid.

According to a fifteenth aspect of the invention, in the liquid heating apparatus according to the fourteenth aspect of the invention, the valve actuator is an airless-open type valve actuator for closing the valve by means of an operational pneumatic pressure during power supply and opening the valve as a result of loss of the operational pneumatic pressure during power interruption, a valve actuator for closing the valve by means of an intermittent operation of a clutch mechanism resisting an energizing member upon the power supply and opening the valve by means of the intermittent operation of the clutch mechanism by the energizing member during the power interruption, or an electric valve actuator for closing the valve during the power supply, and bringing the valve into the open state by means of electric power accumulated in a battery upon the power interruption.

According to a sixteenth aspect of the invention, the liquid heating apparatus according to any one of the fifth to fifteenth aspects of the invention includes a collection unit for collecting the liquid drained by the liquid draining mechanism to the outside of the heating liquid flow passage.

According to a seventeenth aspect of the invention, in the liquid heating apparatus according to any one of the fifth to sixteenth aspects of the invention, a depth of the heating liquid flow passage is equal to or less than 10 mm with respect to the heater.

According to an eighteenth aspect of the invention, there is provided a heated liquid supplying apparatus including the liquid heating apparatus according to any one of the fifth to seventeenth aspects of the invention, a pump for supplying the heating liquid flow passage with the liquid, a power supply control unit for controlling power supply to the heating apparatus and power supply to the pump, and a apparatus stop instruction unit for providing a stop instruction for the apparatus, wherein if the power supply control unit receives the stop instruction from the apparatus stop instruction unit when the liquid heating apparatus and the pump are in operation, the power supply control unit stops the power supply to the liquid heating apparatus to stop the liquid heating apparatus, continues the operation of the pump, and stops the power supply to the pump when a predetermined period has elapsed or a predetermined amount of the liquid has flowed through the heating liquid flow passage from the stop of the liquid heating apparatus, or the temperature of the liquid discharged from the liquid heating apparatus reaches a temperature equal to or less than a predetermined temperature.

Namely, according to the present invention, the liquid to be heated or to receive the remaining heat of the heater at least in the heat receiving area of the liquid flow passage is drained to the outside of the heating liquid flow passage in response to the defective liquid flow in the heating liquid flow passage. As a result, if the defective liquid flow occurs in the heating liquid flow passage, the liquid is prevented from boiling in the heating liquid flow passage to avoid generation of overheated vapor. It should be noted that the defective liquid flow can include a case where the defective liquid flow is actually generated as well as a case where the defective liquid flow highly probably occurs.

Moreover, it can be determined whether the remaining heat is present or not after the heater is stopped by holding a remaining heat temperature as data according to an elapsed time from the stop of the heater in advance, and referring to the data depending on an elapsed time from the stop to estimate the remaining heat temperature when the heater is stopped during the operation. Even if the remaining heat temperature is equal to or higher than the liquid temperature, if the liquid in the heating liquid flow passage will not boil, the liquid draining can be omitted. On this occasion, an upper limit temperature which does not lead to the boiling may be set as a threshold in advance, and if the remaining heat exceeds the threshold, the draining may be carried out.

The heating liquid flow passage is a flow passage in a heating device such as a rapid heating device, and the quantity of liquid residing inside is generally small to enable the rapid heating. For example, the depth of the heating liquid flow passage with respect to the heater (the thickness if the heating liquid flow passage is formed between the opposing surfaces of the liquid flow passage) is preferably equal to or less than 10 mm, and is more preferably equal to or less than 5 mm. On the other hand, the depth of the flow passage (the thickness of the flow passage) is preferably equal to or more than 1 mm for securing sufficient liquid flow, and is more preferably equal to or more than 2 mm. Moreover, the liquid flowing through the heating liquid flow passage preferably passes through the heat receiving area of the heating liquid flow passage in 0.5 to 10 seconds, and more preferably passes in 0.5 to 5 seconds. Moreover, the liquid holdup quantity in the heating liquid flow passage is preferably equal to or less than 0.5 L, and is more preferably 0.05 to 0.2 L. It should be noted that the heat receiving area of the present invention refers to an area receiving a radiation heat transfer of the heater.

Moreover, though the liquid to be flowed through the heating liquid flow passage to be heated is not particularly limited, a sulfuric acid solution or a sulfuric acid solution containing persulfuric acid obtained by electrolysis is preferably used. Moreover, the temperature for heating the liquid can be properly set to a desired temperature depending on necessity. For example, when a sulfuric acid solution of 65 to 96% by mass in sulfuric acid concentration is heated, the solution can be heated to 140 to 220° C.

The defective liquid flow in the present invention includes a case where the liquid flow to the heating liquid flow passage stops, and a case where the flow rate in the heating liquid flow passage decreases to a quantity equal to or less than a predetermined value.

Specifically, when the pump for supplying the heating liquid flow passage with the liquid is stopped due to a power interruption or a pump trouble, or an output of the pump decreases due to a pump trouble or the like and thus a flow rate of the liquid supplied to the heating liquid flow passage becomes a flow rate equal to or less than the predetermined value, the defective liquid flow occurs. It should be noted that the power interruption is a case where the power supply at least to the pump is abruptly interrupted, and includes a power interruption in a local area or an operation site as well as a partial defective power supply in the apparatus. Moreover, the pump trouble is a concept including a failure of the pump itself, and a defective air supply to the air pump due to a failure of the air compressor as well as a defect due to an error in a control logic for controlling the pump.

The heating unit including the flow passage member for forming the heating liquid flow passage through which the liquid is flowed, and the heater arranged on the outside on at least one side of the heating liquid flow passage can be used as the heating unit for heating the liquid.

The flow passage member is not limited to a member having a specific component material, and a flow passage member made of quartz may be used if a near infrared heater such as a halogen lamp heater is used as the heater. The quartz has a heat resistance property, and passes the near infrared, and the employment of the quartz flow passage member can efficiently heat the liquid without preventing the heat transmission from the near infrared heater.

The near infrared heater as well as microwave may be used as the heater.

The drainage of the liquid carried out upon the defective liquid flow can be automatically carried out by providing the heating unit with the liquid draining mechanism, the monitoring unit, and the liquid draining control unit described below.

A configuration of the liquid draining mechanism is not particularly limited as long as the mechanism can drain the liquid from the heating liquid flow passage.

For example, as the liquid draining mechanism, if the heating liquid flow passage is provided approximately in the vertical direction, the draining mechanism including the atmosphere opening line connected to the top side of the heating liquid flow passage, the liquid draining line connected to the bottom side of the heating liquid flow passage, the first valve provided on the atmosphere opening line, and the second valve provided on the liquid draining line may be used. The first valve and the second valve can be placed in the closed state during the normal liquid flow, and can then be brought from the closed state to the open state upon the draining to open the inside of the heating liquid flow passage to the atmosphere via the atmosphere opening line, and to quickly drain the liquid in the heating liquid flow passage via the liquid draining line. It should be noted that the heating liquid flow passage is preferably arranged to be vertical in order to quickly carry out the draining. Moreover, there may be provided a mechanism for moving the heating liquid flow passage to the vertical direction upon the draining.

The liquid drained by the liquid draining mechanism to the outside of the heating liquid flow passage can be collected in the collection unit. The collection of the drained liquid in the collection unit enables the heating again of the collected liquid, thereby using the liquid as the cleaning liquid or the like, resulting in preventing the liquid from being wasted. Moreover, the use of the collection unit enables the collection of the solution strong in oxidizability such as the hot sulfuric acid solution containing persulfuric acid without leakage.

A preheating tank for preheating the liquid before the heating by the heating unit may also be used as the collection unit, or an independent collection container may be used the collection unit.

The monitoring unit is not limited as long as the monitoring unit can monitor the supply state of the liquid supplied to the heating liquid flow passage.

For example, a monitoring unit provided with the flow meter for measuring a flow rate of the liquid supplied to the heating liquid flow passage may be used as the monitoring unit. Moreover, a monitoring unit for detecting an operation state of the pump for supplying the heating liquid flow passage with the liquid may be used as the monitoring unit. Specifically, if the liquid is supplied to the heating liquid flow passage by the air pump, a monitoring unit provided with a pressure gauge for measuring a pneumatic pressure of the air pump may be used as the monitoring unit.

It should be noted that any one of the flow meter and the pressure gauge may be used independently, or both thereof may be used simultaneously.

The monitoring unit may monitor the supply state of the liquid as well as a heated state by the heating unit. A power supply state to the heater, a measured temperature of the heating unit, and the elapsed time after the heater stops, for example, may be referred to for monitoring the heated state.

The liquid draining control unit provides such control as receiving the monitoring result by the monitoring unit, determining a defective liquid flow in the heating liquid flow passage based on the monitoring result, and carrying out the draining of the liquid by the liquid draining mechanism in response to the defective liquid flow. For example, if the flow rate of the liquid measured by the flow meter is zero or equal to or less than the predetermined value, or if the pneumatic pressure measured by the pressure gauge in the air pump is zero or equal to or less than a predetermined value, the generation of the defective liquid flow is determined in the heating liquid flow passage. Numerical values may be set in advance in a storage unit or the like as the predetermined values, or a flow rate or a pressure in a normal state may be measured, and degrees in decrease with respect to the normal flow rate and the pressure may be defined as the predetermined values.

If the monitoring unit monitors the supply state of the liquid supplied to the heating liquid flow passage and the heated state by the heating unit, the liquid draining control unit can provide such control as receiving the monitoring result by the monitoring unit, determining the defective liquid flow in the heating flow passage, and the heating continuation in the heating unit based on the monitoring result, and carrying out the draining of the liquid in response to the heating continuation and the defective liquid flow by the liquid draining mechanism.

The defective liquid flow is the same as that described above. Regarding the continuation of the heating, if the heater is operating, the heating is determined to be continuing. Moreover, even after the heater stops, if the remaining heat is equal to or more than the heated temperature of the liquid, the state can be determined as a state of the heating continuation. Whether the heating continues or not may be determined depending on the temperature provided by the remaining heat on this occasion. In other words, if the remaining heat can boil the liquid, the heating is determined to be continuing, and if the remaining heat cannot boil the liquid, the heating is not determined to be continuing.

The draining control unit can be constructed mainly by a CPU and a program for operating the CPU, and additionally includes a RAM serving as a work area, a ROM for storing the program and the like, and a nonvolatile memory for storing operation parameters, the thresholds, and the predetermined values used for the determinations.

Moreover, the liquid draining control unit carries out the control of draining the liquid by the liquid draining mechanism as well as preferably carries out control of stopping the power supply to the heating unit. When the defective liquid flow occurs, and the liquid is drained, wasteful consumption of energy can be avoided, and safe and quick resumption of the heating of the liquid is enabled by further stopping the power supply to the heating unit.

Moreover, if the liquid draining mechanism includes the atmosphere opening line, the liquid draining line, the first valve, and the second valve, the liquid draining control unit provides the control of bringing the first valve and the second valve from the closed state to the open state when the liquid is drained. In this case, the first valve and the second valve are in the closed state for a normal liquid flow other than the defective liquid flow. The closing operation of the valves in the normal state may be carried out by the liquid draining control unit, or may be carried out by the valve actuators which carry out the closing operation when the control by the liquid draining control unit is turned off.

It should be noted that if the liquid heating apparatus includes an uninterruptible power supply which can supply at least the control unit with electric power, the control unit can provide the control of draining the liquid by the liquid draining mechanism during power interruption across the entire apparatus. Moreover, there may be provided such a configuration that the electric power is supplied by the uninterruptible power supply to the respective components constructing the liquid draining unit as well as the liquid draining mechanism and the monitoring unit so that the respective units operate during the power interruption.

However, the respective components and the uninterruptible power supply need to be connected with each other via wiring cables, the apparatus configuration becomes complex, the cost slightly increases, and valve actuators having a failsafe mechanism against the power interruption are thus preferably used.

Then, the liquid draining mechanism can be constructed by the failsafe mechanism so as to drain the liquid upon the power interruption. In this case, the monitoring unit and the control unit as described above need not to be provided as long as the liquid draining mechanism operates upon the stop of power supply to carry out the liquid draining operation.

For example, it is assumed that the liquid draining mechanism is a mechanism including the atmosphere opening line connected to the top side of the heating liquid flow passage, the liquid draining line connected to the bottom side of the heating liquid flow passage, the first valve provided on the atmosphere opening line, and the second valve provided on the liquid draining line. It is further assumed that each of the first valve and the second valve is a valve including a valve actuator provided with the failsafe mechanism, and the respective valve actuators operate to bring the first valve and the second valve from the closed state when the electric power is supplied to the open state upon the power interruption where the power supply to the pump for supplying at least the heating liquid flow passage with the liquid abruptly stops. The liquid draining mechanisms as described above bring the first valve and the second valve from the closed state to the open state by the valve actuators upon the power interruption, the heating liquid flow passage is opened to the atmosphere thorough the atmosphere opening line, and the liquid in the heating liquid flow passage is drained via the liquid draining line.

A pneumatic valve actuator, a clutch-type valve actuator, an electric valve actuator, and the like can be used as the valve actuator, and, specifically, an airless-open type valve actuator for closing the valve by an operational pneumatic pressure during the power supply and opening the valve due to loss of the operational pneumatic pressure upon the power interruption, a clutch-type valve actuator for bringing a clutch mechanism in a transmission state resisting an energizing member such as a spring during the power supply to close the valve, and causing the energizing means to release the transmission by the clutch mechanism upon the power interruption to open the valve, an electric valve actuator for closing the valve during the power supply, and bringing the valve into the open state by electric power accumulated in a battery upon the power interruption, and the like can be mentioned.

Moreover, the heated liquid supplying apparatus provided with the liquid heating apparatus preferably provides control of preventing the liquid in the rapid heating device from boiling when an operator intends to stop the apparatus. For example, the heated liquid supplying apparatus is configured to carry out control of stopping the power supply to the liquid heating apparatus upon reception of a stop instruction, continuing the operation of the pump, and stopping the power supply to the pump after the predetermined time has elapsed from the stop of the liquid heating apparatus or the predetermined amount of the liquid has flowed through the heating flow passage, or after the temperature of the liquid discharged from the liquid heating apparatus decreases to a temperature equal to or less than the predetermined temperature. As a result, the liquid is surely prevented from boiling in the heating unit. The control may be carried out by the power supply control unit. The power supply control unit can be constructed mainly by a CPU and a program for operating the CPU, and additionally includes a RAM serving as a work area, a ROM for storing the program and the like, and a nonvolatile memory for storing operation parameters, conditions for continuing operation of the pump after the stop instruction, and the like. The power supply control unit may be provided independently of the liquid draining control unit, or a control unit serving both as the power supply control unit and the liquid draining control unit may be provided.

Effect of the Invention

As described above, according to the present invention, the liquid flowing in the heat receiving area of the heating liquid flow passage is heated by the heater arranged outside the heating liquid flow passage while the liquid is flowing through the heating liquid flow passage, the liquid heated by the heater or receiving the remaining heat at least in the heat receiving area is drained to the outside of the heating liquid flow passage in response to the defective liquid flow in the heating liquid flow passage during the heating by the heater or when the remaining heat corresponding to a temperature exceeding at least the heated temperature of the liquid is left due to the heating in portions other than the liquid after the heater is stopped, and thus the liquid can be prevented from boiling to avoid the generation of the overheated vapor even if the defective liquid flow occurs in the heating liquid flow passage.

MODE FOR CARRYING OUT THE INVENTION

First Embodiment

A description will now be given of a heated liquid supplying apparatus provided with a liquid heating apparatus according to an embodiment of the present invention referring to FIGS. 1 and 2.

Figure 1:
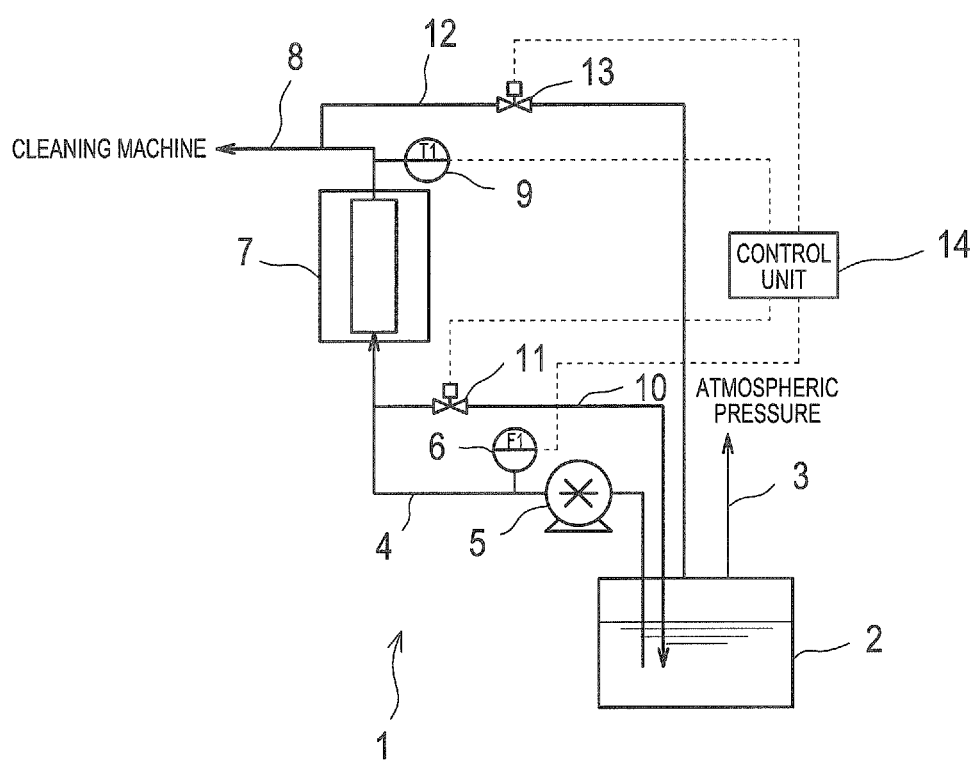
FIG. 1 is a schematic diagram showing a liquid heating apparatus according to an embodiment of the present invention.

The heated liquid supplying apparatus 1 includes a preheating tank 2 for preheating a sulfuric acid solution containing persulfuric acid, and a heating device 7 for heating the sulfuric acid preheated by the preheating tank 2 as shown in FIG. 1. The heating device 7 corresponds to a heating unit of the present invention, and is arranged so that a heating liquid flow passage passes through in a vertical direction. Moreover, the preheating tank 2 has a function as a collection unit of the present invention.

The preheating tank 2 retains the sulfuric acid solution including persulfuric acid. The sulfuric acid concentration of the sulfuric acid solution is 65 to 96% by mass. A sulfuric acid solution containing persulfuric acid generated by electrolysis of the sulfuric acid solution is supplied to the preheating tank 2. It should be noted that an SPM solution manufactured by mixing a sulfuric acid solution and a hydrogen peroxide solution may be used as the sulfuric acid solution containing persulfuric acid.

A heater, which is not shown, is provided in the preheating tank 2, and the heater can preheat the sulfuric acid solution stored in the preheating tank 2. Moreover, an atmosphere opening line 3 is connected to the preheating tank 2 to open the inside of the preheating tank 2 to the atmospheric pressure.

An upstream end of the upstream side supply line 4 for supplying the heating device 7 with the sulfuric acid solution in the preheating tank 2 is connected to the preheating tank 2. A downstream end of the upstream side supply line 4 is connected to a liquid inlet side of a bottom portion of the heating device 7. An air pump 5 for feeding the sulfuric acid solution from the preheating tank 2 side toward the heating device 7 side is interposed on the upstream side supply line 4. The air pump 5 corresponds to a pump of the present invention. It should be noted that various pumps may be used in place of the air pump 5.

Moreover, a flow meter 6 for measuring a flow rate of the sulfuric acid flowing through the upstream side supply line 4 is provided on a downstream side of the air pump 5 on the upstream side supply line 4. The flow meter 6 constructs a monitoring unit of the present invention. An output signal of the flow meter 6 is transmitted to the control unit 14.

The control unit 14 controls the entire heated liquid supplying apparatus 1, can be constructed mainly by a CPU and a program for operating the CPU, and additionally includes a RAM serving as a work area, a ROM for storing the program and the like, and a nonvolatile memory for storing predetermined values used for determining defective liquid flow. Namely, the control unit 14 functions as a liquid draining control unit of the present invention.

An upstream end of the downstream side supply line 8 for supplying a cleaning machine, which is not shown, with the sulfuric acid solution heated by the heating device 7 is connected to a discharge side of a top portion of the heating device 7. A thermometer 9 for measuring a liquid temperature of the sulfuric acid solution flowing through the downstream side supply line 8 is provided on the downstream side supply line 8. An output signal of the thermometer 9 is transmitted to the control unit 14. The control unit 14 for receiving the output signal of the thermometer 9 adjusts an output (pump flow rate) of the air pump 5 and a heating temperature in the heating device 9 so that the sulfuric acid solution heated by the heating device 7 reaches a predetermined temperature.

A description will now be given of a specific structure of the heating device 7 referring to FIGS. 2(a), 2(b), and 2(c).

FIG. 2(a) is a cross sectional view along a horizontal plane of the heating device 7, FIG. 2(b) is a vertical cross sectional view of the heating device 7, and FIG. 2(c) is a horizontal cross sectional view enlarging a tubular flow passage 70.

The heating device 7 includes a double tube constructed by an inner tube wall 71a and an outer tube wall 71b, and forming a tubular flow passage 70 through which the sulfuric acid flows, heaters 72 and 73 for heating the sulfuric acid in a heat receiving area inside the tubular flow passage 70, and a housing 74 having a heat insulating structure as shown. The inner tube wall 71a, the outer tube wall 71b, and the heaters 72 and 73 are stored in the housing 74. The tubular flow passage 70 corresponds to a heating liquid flow passage of the present invention. Moreover, the inner tube wall 71a and the outer tube wall 71b correspond to a flow passage member of the present invention.

The tubular flow passage 70 is formed by the double tube structure having diameters close to each other, and the tubular flow passage 70 is secured between the inner tube wall 71a and the outer tube wall 71b. The inner tube wall 71a and the outer tube wall 71b are respectively made of quartz. The thickness of the tubular flow passage 70 (difference between an inner diameter of the outer tube wall 71b and an outer diameter of the inner tube wall 71a) is preferably equal to or less than 10 mm, and is more preferably 1 to 5 mm. The residence time of the sulfuric acid solution in the tubular flow passage 70 is preferably 0.5 to 10 seconds, and the flow rate of the sulfuric acid solution supplied to the tubular flow passage 70 is preferably 0.5 to 1.5 L/min. In this case, a quantity of the sulfuric acid solution (liquid holdup quantity) residing in the tubular flow passage 70 is 100 to 150 mL when the supply of the sulfuric acid solution to the tubular flow passage 70 is stopped.

The tubular flow passage 70 is arranged so that an axial direction aligns with the vertical direction, the downstream end of the upstream side supply line 4 is connected to the bottom side, which is the liquid inlet side of the tubular flow passage 70, and the upstream end of the downstream side supply line 8 is connected to the top side, which is the liquid discharge side of the tubular flow passage 70 as described above.

A plurality of heaters 72 in a rod shape in the axial direction of the tubular flow passage 70 are arranged at an equal angular interval in a circumferential direction concentric with the tubular flow passage 70 outside an outer periphery of the tubular flow passage 70. Moreover, one heater 73 in a rod shape is arranged at a center position of the tubular flow passage 70 along the axial direction of the tubular flow passage 70 inside an inner periphery of the tubular flow passage 70. Halogen lamp heaters, for example, are used as heaters 72 and 73.

Figure 2:
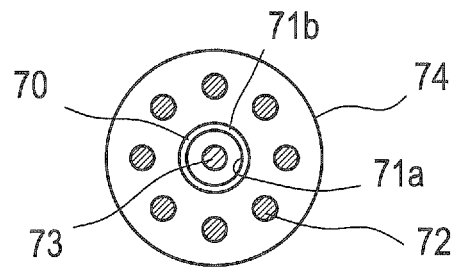
FIG. 2 is a schematic diagram showing a heating device in the liquid heating apparatus according to the embodiment of the present invention.
Figure 2:
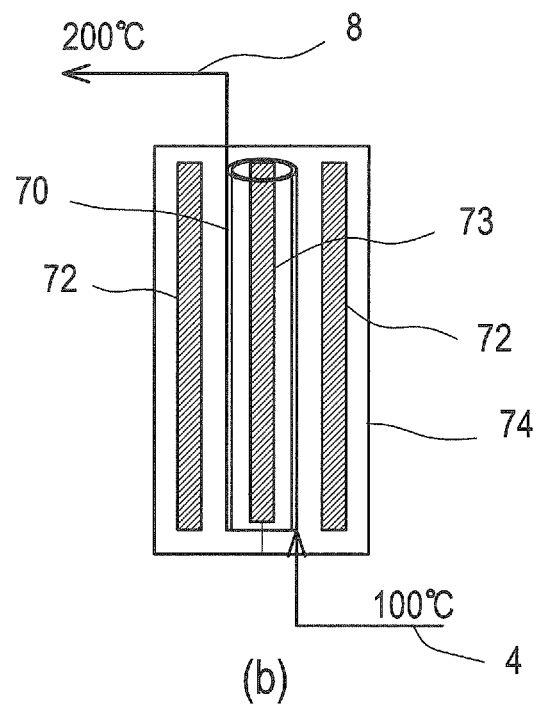
Figure 2:
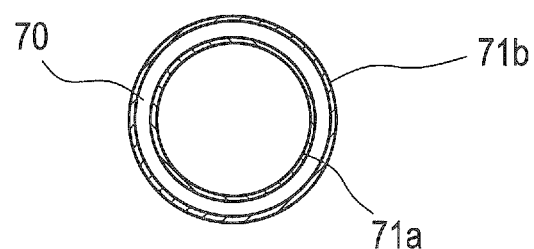

It should be noted that the configuration of the heating device 7 is not limited to the configuration shown in FIG. 2, and various configurations can be employed.

One end of the liquid draining line 10 branches and is connected to the upstream side supply line 4 connected to the liquid inlet side of the tubular flow passage 70 on a downstream side of the flow meter 6 as shown in FIG. 1. The other end of the liquid draining line 10 is connected via a valve 11 to the preheating tank 2. Namely, the liquid draining line 10 connects via the upstream side supply line 4 with a bottom side of the tubular flow passage 70, which is the heating liquid flow passage.

The valve 11 corresponds to a second valve of the present invention. The valve 11 is usually in a closed state, and an opening/closing operation is controlled by the control unit 14 described below.

It should be noted that the preheating tank 2 is arranged below the heating device 7 so that the sulfuric acid solution in the tubular flow passage 70 of the heating device 7 flows down by its own weight, and the sulfuric acid solution is collected via a part of the upstream side supply line 4 and the liquid draining line 10 in the preheating tank 2 when the sulfuric acid solution is drained as described below.

Then, the connection position to the upstream side supply line 4 is at the highest position, and the connection position to the preheating tank 2 is at the lowest position on the liquid draining line 10. The height on the liquid draining line 10 preferably decreases gradually from the connection position to the upstream side supply line 4 to the connection position to the preheating tank 2. It should be noted that the liquid draining line 10 may include a portion which remains at the same height.

One end of the atmosphere opening line 12 branches and is connected to the downstream side supply line 8 connected to the liquid outlet side of the tubular flow passage 70 on the downstream side of the thermometer 9. The other end of the atmosphere opening line 12 is connected via a valve 13 to the preheating tank 2. Namely, the atmosphere opening line 12 connects with a top side of the tubular flow passage 70, which is the heating liquid flow passage, via the downstream side supply line 8. The valve 13 corresponds to a first valve of the present invention. The valve 13 is usually in a closed state, and an opening/closing operation is controlled by the control unit 14.

The valves 11 and 13 are connected to the control unit 14 in a controllable manner. The control unit 14 receives a measurement result by the flow meter 6 to control the opening/closing of the valves 11 and 13 in response to the measurement result.

Moreover, the air pump 5 is connected to the control unit 14 in a controllable manner. The control unit 14 can transmit a control signal for controlling the pump flow rate of the air pump 5 to the air pump 5, and the control unit 14 can also transmit a control signal for stopping the power supply to the air pump 5 to stop the air pump 5 to the air pump 5.

Moreover, the heating device 7 is connected to the control unit 14 in a controllable manner. The control unit 14 can transmit a control signal for controlling the heating temperature of the heating device 7 to the heating device 7, and the control unit 14 can also transmit a control signal for stopping the power supply to the heating device 7 to stop the heating device 7 to the heating device 7.

The control unit 14 can function as a power supply control unit of the present invention for controlling the power supply to the heating device 7 and the power supply to the air pump 5.

Moreover, an apparatus stop instruction unit (not shown) for providing the heating device 7 and the air pump 5 with stop instructions can be connected to the control unit 14. The operator provides the control unit 14 with the stop instruction via the apparatus stop instruction unit to stop the heating device 7 and the air pump 5.

The heating apparatus according to the present invention is constructed by the heating device 7, the liquid draining line 10, the atmosphere opening line 12, the valves 11 and 13, the flow meter 6, and the control unit 14 according to the first embodiment.

A description will now be given of an operation of the liquid heating apparatus shown in FIGS. 1 and 2.

The stored sulfuric acid solution is heated to and is maintained at 90 to 120° C., for example, by the heater, which is not shown, in the preheating tank 2.

The sulfuric acid solution in the preheating tank 2 is introduced by the air pump 5 via the upstream side supply line 4 into the liquid inlet side (bottom side) of the tubular flow passage 70 of the heating device 7. The sulfuric acid solution introduced into the bottom side of the tubular flow passage 70 generates an upward stream, rises in the tubular flow passage 70, and is discharged from the top side which is a liquid outlet side of the tubular flow passage 70. The sulfuric acid solution is heated by radiation heat of the heaters 72 and 73 while the sulfuric acid solution rises in and passes through the tubular flow passage 70. The sulfuric acid solution passes through a heat receiving area of the tubular flow passage 70, namely an area receiving the radiant heat from the heaters 72 and 73, in 0.5 to 10 seconds, for example. It should be noted that the temperature of the sulfuric acid solution introduced into the tubular flow passage 70 is 90 to 120° C. as a result of the heating by the preheating tank 2. The sulfuric acid solution discharged from the tubular flow passage 70 has a liquid temperature of 140 to 220° C., for example, as a result of the heating by the heaters 72 and 73.

It should be noted that the control unit 14 maintains the valves 11 and 13 in the closed state while the defective liquid flow is not generated, and the sulfuric acid solution is heated by the heating device 7 as described above.

The sulfuric acid solution discharged from the top side of the tubular flow passage 70 is supplied via the downstream side supply line 8 to the cleaning machine. The temperature of the sulfuric acid solution flowing through the downstream side supply line 8 is measured continuously or intermittently by the thermometer 9 to control the pump 5 and the heaters 72 and 73 so as to attain a predetermined temperature.

Namely, the control unit 14 transmits a control signal for controlling a pump flow rate of the air pump 5 to the air pump 5 in response to a request from the cleaning machine or the like to control the pump flow rate of the air pump 5. Moreover, the control unit 14 receives a measurement result by the thermometer 9, and transmits a control signal for controlling the heating temperature by the heating device 7 to the heating device 7 in response to the measurement result to control the heating temperature by the heating device 7.

An electronic material substrate such as a semiconductor wafer is cleaned by the sulfuric acid solution supplied from the downstream side supply line 8 in the cleaning machine.

While the sulfuric acid solution is heated in the heating device 7 as mentioned above, a flow rate of the sulfuric acid solution flowing through the upstream side supply line 4 is continuously or intermittently measured in the flow meter 6. A supply state of the sulfuric acid solution supplied to the tubular flow passage 70 of the heating device 7 is monitored by the flow meter 6 in this way. A measurement result by the flow meter 6 is transmitted from the flow meter 6 to the control unit 14.

The control unit 14 receives a measurement result by the flow meter 6, and determines a liquid flow state in the tubular flow passage 70 of the heating device 7 based on the measurement result. Specifically, the control unit 14 determines that the defective liquid flow occurs in the tubular flow passage 70 if the flow rate of the sulfuric acid solution measured by the flow meter 6 is zero or equal to or less than a predetermined value. It should be noted that the predetermined value is set in advance, and is stored in the nonvolatile memory of the control unit 14.

If the control unit 14 determines that the defective liquid flow occurs, the control unit 14 generates a control signal for bringing the valves 11 and 13 from the closed state to the open state, and transmits the control signal to the valves 11 and 13 thereby bringing the valves 11 and 13 from the closed state to the open state. Simultaneously, the control unit 14 generates control signals for stopping the air pump 5 and the heating device 7, transmits the control signals to the air pump 5 and the heating device 7, thereby stopping the air pump 5 and the heating device 7. It should be noted that the air pump 5 may continue the operation for a certain period, and may then stop after the heating device 7 is stopped.

When the valves 11 and 13 are brought into the open state by the control unit 14, an inside of the atmosphere opening line 12 connected to the preheating tank 2 opened to the atmospheric pressure is opened to the atmosphere. As a result, the inside of the tubular flow passage 70 is opened to the atmospheric pressure via the atmosphere opening line 12. The sulfuric acid solution in the tubular flow passage 70 is then drained so as to flow down by its own weight, and is collected via a part of the upstream side supply line 4 and the liquid draining line 10 in the preheating tank 2. As a result, even if the heating is being carried out by the heaters 72 and 73 or the residual heat remains after the heaters 72 and 73 stop, the sulfuric acid solution is prevented from boiling, and the generation of the overheated vapor is avoided. Control without the liquid draining can be carried out if defective liquid flow occurs in a state where the liquid is not overheated such as a case where a time has elapsed after the heaters 72 and 73 stopped. A case where a predetermined time has elapsed after the heaters 72 and 73 stop, a case where the liquid in a predetermined amount of the liquid has flowed through the tubular flow passage 70 after the heaters 72 and 73 stop, and a case where the residual heat temperature of the heating unit is equal to or less than a predetermined temperature can be mentioned as the case where the liquid draining is not carried out.

A control logic of automatically bringing the valves 11 and 13 into the closed state upon a recovery from the trouble causing the defective liquid flow such as a power interruption is built into the control unit 14. Moreover, a control logic of maintaining the stop state of the air pump 5 and the heating device 7 is preferably built into the control unit 14 even upon the recovery from the trouble if the air pump 5 and the heating device 7 are stopped due to the trouble. As a result, it is possible to prevent a case where the sulfuric acid solution is supplied to the heating device 7 immediately after the recovery from the trouble, and the sulfuric acid solution instantaneously boils.

When the temperature in the heating device 7 decreases as a result of release of the heat from the heating device 7 after the recovery from the trouble, the supply of the sulfuric acid solution can safely be resumed. If the temperature at a liquid contact portion in the heating device 7 is equal to or less than the boiling point of the sulfuric acid solution, though the sulfuric acid solution will not boil, it is generally difficult to directly measure the temperature of the liquid contact portion. Thus, preferably, a temperature at an intermediate portion such as a heat insulating material in the heating device 7 is measured, a worker or the like confirms that the temperature at the intermediate portion is sufficiently low compared with the boiling point of the sulfuric acid solution, thereby estimating that the temperature at the liquid contact portion is lower than the boiling point, the operation of the air pump 5 is restarted, and the operation of the heating device 7 is restarted.

Moreover, when the operation of the liquid heating apparatus in which the heating device 7 and the air pump 5 are in the operating state is usually stopped, the worker provides the control unit 14 with a stop instruction via the apparatus stop instruction unit, which is not shown.

When the control unit 14 receives the stop instruction from the apparatus stop instruction unit, the control unit 14 carries out control of stopping the power supply to the heating device 7 to stop the heating device 7, continuing the operation of the air pump 5, and then stopping the power supply to the air pump 5 to stop the air pump 5. After the predetermined time has elapsed from the stop of the heating device 7, after the predetermined amount of the sulfuric acid solution has flowed through the heating flow passage 70, or after the temperature of the sulfuric acid solution discharged from the heating device 7 has reached a temperature equal to or less than the predetermined temperature, the control unit 14 carries out control of stopping the power supply to the air pump 5 to stop the air pump 5.

The heating device 7 and the air pump 5 are stopped, and the operation of the liquid heating apparatus is generally stopped in this way.

Second Embodiment

A description will now be given of the liquid heating apparatus according to another embodiment of the present invention referring to FIG. 3. It should be noted that like configuration are denoted by like numerals as of the first embodiment, and a description thereof is therefore omitted or simplified.

Though a description is given of the case where the supply state of the sulfuric acid solution supplied to the tubular flow passage 70 of the heating device 7 is monitored by the flow meter 6 in the first embodiment, a supply state of the sulfuric acid may be monitored by a pressure gauge for measuring a pneumatic pressure of the air pump 5.

The liquid heating apparatus according to this embodiment is a liquid heating apparatus constructed by providing the liquid heating apparatus shown in FIGS. 1 and 2 with a pressure gauge 20 for measuring the pneumatic pressure of the air pump 5 in place of the flow meter 6, and monitors the supply state of the sulfuric acid solution by the air pump 20.

Figure 3:
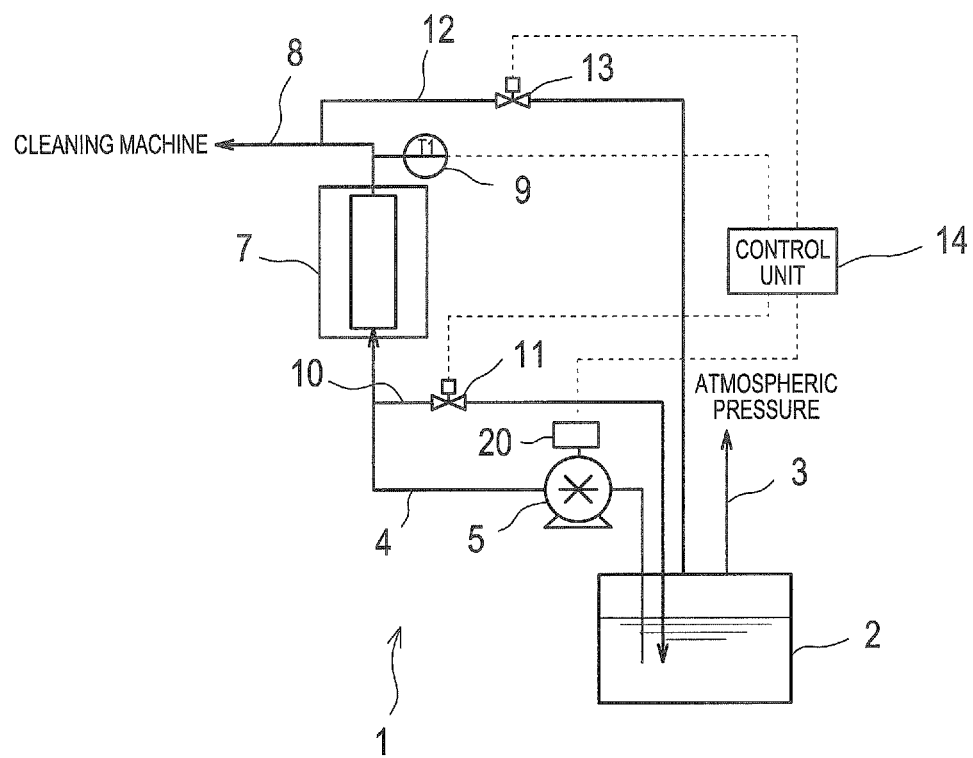
FIG. 3 is a schematic diagram showing the liquid heating apparatus according to another embodiment of the present invention.

The liquid heating apparatus according to this embodiment includes the pressure gauge 20 for measuring the pneumatic pressure of the air pump 5, and the pressure gauge 20 is connected to the air pump 5 as shown in FIG. 3. The pressure gauge 20 partially constructs the monitoring unit of the present invention.

The pressure gauge 20 is connected to an uninterruptible power supply, which is not shown, and can operate by a power supply from the uninterruptible power supply during the power interruption.

The pressure gauge 20 is connected to the control unit 14, and an output signal serving as a measurement result by the pressure gauge 20 is transmitted to the control unit 14.

The valves 11 and 13 are connected to the control unit 14. The control unit 14 receives a measurement result by the pressure gauge 20, and transmits control signals to bring the valves 11 and 13 from the closed state to the open state to the valves 11 and 13 in response to the measurement result.

A description will now be given of an operation of the liquid heating apparatus shown in FIG. 3.

The heating of the sulfuric acid solution by the heating device 7 is carried out, and the heated sulfuric acid solution is supplied via the downstream side supply line 8 to the cleaning machine in the liquid heating apparatus shown in FIG. 3 as in the liquid heating apparatus shown in FIGS. 1 and 2. An electronic material substrate such as a semiconductor wafer is cleaned by the sulfuric acid solution supplied from the downstream side supply line 8 in the cleaning machine.

While the sulfuric acid is heated in the heating device 7, the pneumatic pressure of the air pump 5 for feeding the sulfuric acid solution to the tubular flow passage 70 of the heating device 7 is continuously or intermittently measured in the pressure gauge 20. Namely, a supply state of the sulfuric acid solution supplied to the tubular flow passage 70 of the heating device 7 is monitored by the pressure gauge 20.

The control unit 14 receives a measurement result by the pressure gauge 20, and determines the defective liquid flow in the tubular flow passage 70 of the heating device 7 based on the measurement result. Specifically, the control unit 14 determines that the defective liquid flow occurs in the tubular flow passage 70 if the pneumatic pressure measured by the pressure gauge 20 is zero or equal to or less than a predetermined value. Such a defective liquid flow can be generated by a trouble such as a stop or a decrease in output of the air pump 5 due to a power interruption, a failure, an error in the control logic, and the like as in the first embodiment. It should be noted that the predetermined value is set in advance, and is stored in the nonvolatile memory of the control unit 14.

If the control unit 14 determines that the defective liquid flow occurs, the control unit 14 generates a control signal for bringing the valves 11 and 13 from the closed state to the open state, and transmits the control signals to the valves 11 and 13 thereby bringing the valves 11 and 13 from the closed state to the open state. Simultaneously, the control unit 14 generates control signals for stopping the air pump 5 and the heating device 7, transmits the control signals to the air pump 5 and the heating device 7, thereby stopping the air pump 5 and the heating device 7.

When the valves 11 and 13 are brought into the open state by the control unit 14, the sulfuric acid solution in the tubular flow passage 70 flows down by its own weight, and is drained via the part of the upstream side supply line 4 and the liquid draining line 10 from the tubular flow passage 70, and is collected in the preheating tank 2 as in the first embodiment.

The operation of the liquid heating apparatus shown in FIG. 3 can be normally stopped as in the case of the first embodiment.

Moreover, though a description is given of the case where the pressure gauge 20 is provided in place of the flow meter 6, the pressure gauge 20 is provided along with the flow meter 6 provided as in the first embodiment, and the supply state of the sulfuric acid solution may be monitored by both thereof.

Third Embodiment

A description will now be given of the liquid heating apparatus according to still another embodiment of the present invention referring to FIG. 4. Like configurations are denoted by like numerals as of the first and second embodiments, and a description thereof is therefore omitted or simplified.

Though the valves 11 and 13, the flow meter 6, and the pressure gauge 20 are connected to the control unit 14 for the detection and the control according to the first and second embodiments, their operations stop during the power interruption. To address this problem, such a configuration is employed that they are connected to an uninterruptible power supply so as to operate even during the power interruption. However, the valves 11 and 13 and the like and the uninterruptible power supply need to be connected with each other via wiring cables or the like, the apparatus configuration becomes complex, and the cost slightly increases. The increase in complexity of the apparatus configuration and the slight increase in cost can be avoided by using, in place of the valves 11 and 13, valves each having a valve actuator including a failsafe mechanism for handling the power interruption.

The liquid heating apparatus according to this embodiment uses, in place of the valves 11 and 13, valves 31 and 33 each having a valve actuator including a failsafe mechanism handling the power interruption in the liquid heating apparatus illustrated in FIGS. 1 and 2 in order to avoid the increase in complexity of the apparatus configuration and the slight increase in cost.

Figure 4:
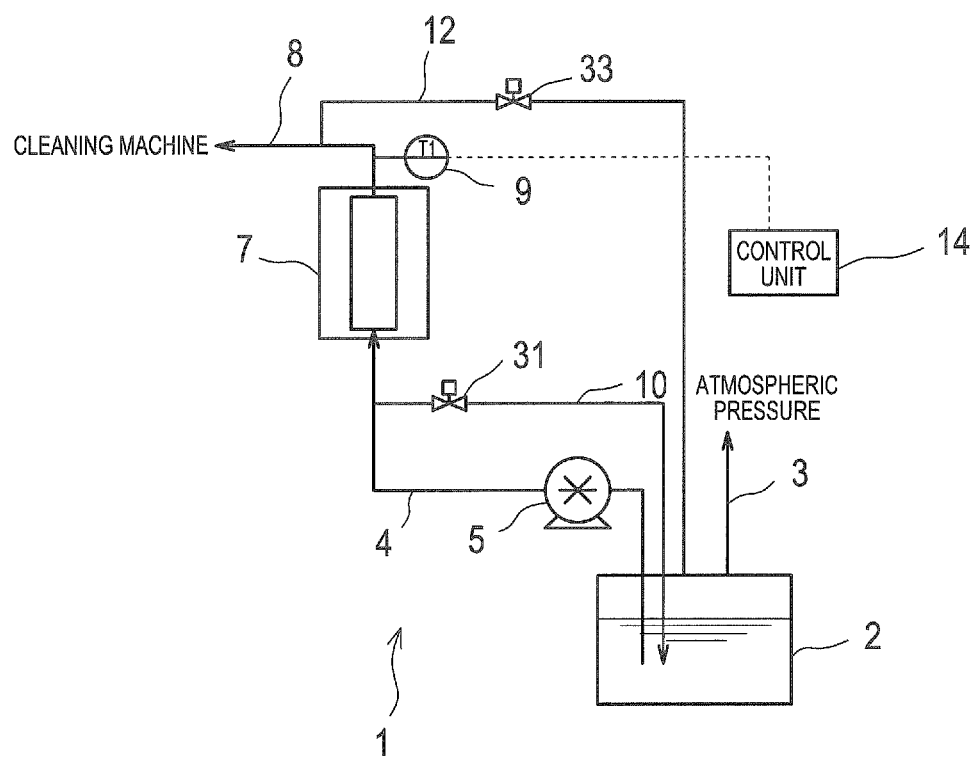
FIG. 4 is a schematic diagram showing the liquid heating apparatus according to still another embodiment of the present invention.

As illustrated in FIG. 4, the valve 31 including the valve actuator is interposed in place of the valve 11 on the liquid draining line 10. The valve actuator of the valve 31 has a failsafe mechanism for maintaining the valve 31 in the closed state in the power supply state, which is the normal state, and opening the valve 31 from the closed state to the open state when the power interruption occurs. Moreover, the valve 31 can be operated also by the control signal from the control unit 14 as the valve 11.

Moreover, the valve 33 including the valve actuator is provided in place of the valve 13 on the atmosphere opening line 12. The valve actuator of the valve 33 has a failsafe mechanism for maintaining the valve 33 in the closed state in the power supply state, which is the normal state, and opening the valve 33 from the closed state to the open state when the power interruption occurs. Moreover, the valve 33 can be operated also by the control signal from the control unit 14 as the valve 13.

The flow meter 6 and the control unit 14 operate similarly to the flow meter 6 and the control unit 14 in the liquid heating apparatus shown in FIGS. 1 and 2, but they are not connected to an uninterruptible power supply.

A description will now be given of the operation of the liquid heating apparatus illustrated in FIG. 4.

The sulfuric acid solution is heated by the heating device 7 and the heated sulfuric acid solution is supplied to the cleaning machine via the downstream side supply line 8 in the liquid heating apparatus illustrated in FIG. 4 similarly to the liquid heating apparatus illustrated in FIGS. 1 and 2. An electronic material substrate such as a semiconductor wafer is cleaned by the sulfuric acid solution supplied from the downstream side supply line 8 in the cleaning machine.

If a power interruption which abruptly stops the power supply to the air pump 5 and the like occurs while the sulfuric acid solution is heated by the heating device 7 as described above, the valve actuator of the valve 31 carries out the operation to bring the valve 31 from the closed state to the open state as a result of the action of the failsafe mechanism. The valve actuator of the valve 33 simultaneously carries out the operation to open the valve 33 from the closed state to the open state as the result of the action of the failsafe mechanism. The valves 31 and 33 are closed in the power supply state, and open when the power supply is interrupted.

When the valves 31 and 33 are brought into the open state by the respective valve actuators, the sulfuric acid solution in the tubular flow passage 70 flows down by its own weight, and is collected via the part of the upstream side supply line 4 and the liquid draining line 10 in the preheating tank 2 as in the first embodiment. The sulfuric acid solution in the tubular flow passage 70 is drained to the outside of the tubular flow passage 70 in this way during the power interruption where the defective liquid flow occurs in the tubular flow passage 70.

Moreover, the operation of the liquid heating apparatus shown in FIG. 4 can be normally stopped as in the case of the first embodiment.

Fourth Embodiment

A description will now be given of the liquid heating apparatus according to yet another embodiment of the present invention referring to FIG. 5. Like configurations are denoted by like numerals as of the first to third embodiments, and a description thereof is therefore omitted or simplified.

A difference in level is secured between the heating device 7 and the preheating tank 2, and the sulfuric acid solution in the tubular flow passage 70 flows down by its own weight, and is collected via the part of the upstream side supply line 4 and the draining line 10 in the preheating tank 2 for draining the liquid according to the first to third embodiments.

However, there can be a case where the difference in level cannot be secured between the heating device 7 and the preheating tank 2 for the sake of the arrangement of the devices and the like. A collection container may be installed independently of the preheating tank 2 and the drained sulfuric acid solution may be collected in the collection container in this case.

The liquid heating apparatus according to this embodiment has such a configuration that a collection container 40 for collecting the drained sulfuric acid solution is installed independently of the preheating tank 2.

Figure 5:
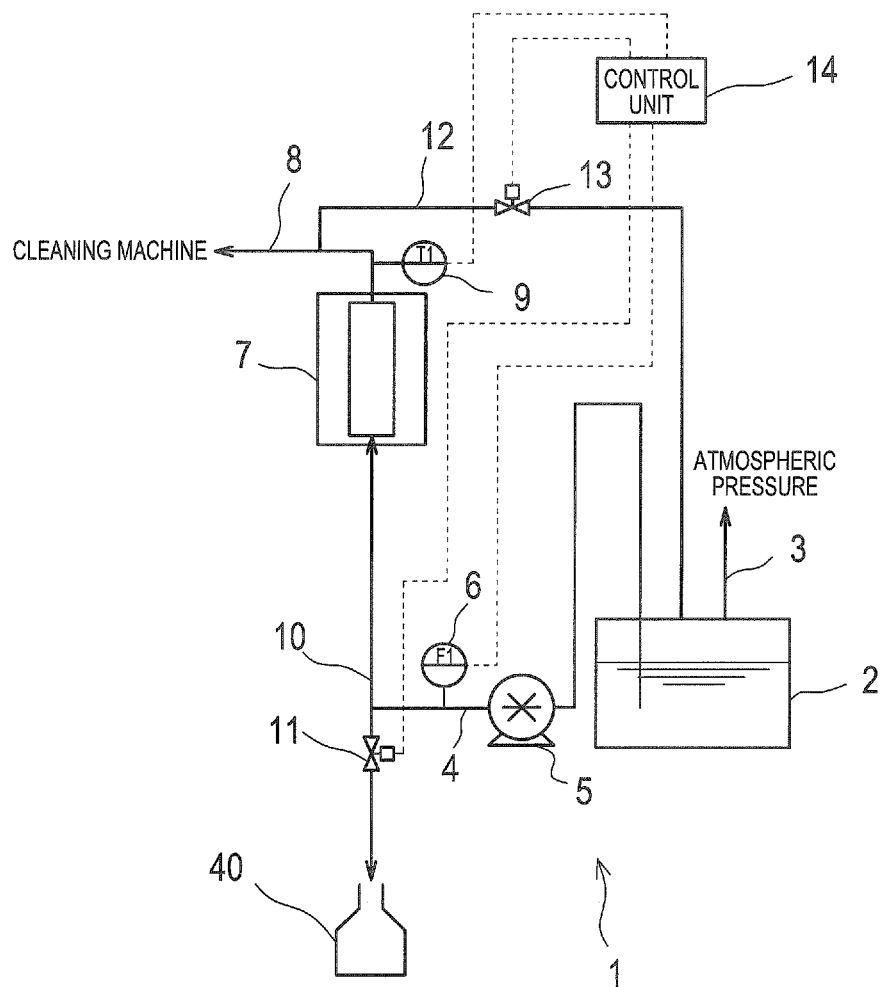
FIG. 5 is a schematic diagram showing the liquid heating apparatus according to yet another embodiment of the present invention.
Figure 6:
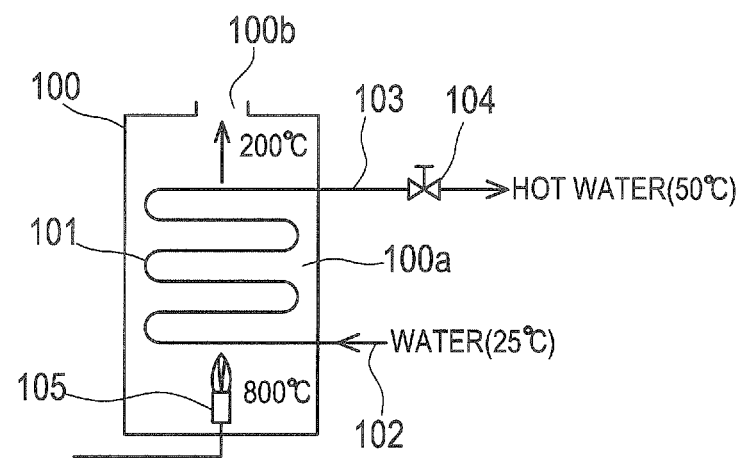
FIG. 6 is a schematic diagram showing a general household gas instantaneous water heater.

The preheating tank 2 is similarly installed below the heating device 7 in the liquid heating apparatus according to this embodiment as shown in FIG. 5. However, a sufficient difference in level for the sulfuric acid solution in the tubular flow passage 70 of the heating device 7 to flow down by its own weight and to be collected in the preheating tank 2 is not secured between the heating device 7 and the preheating tank 2.

One end of the liquid draining line 10 branches and is connected to the upstream side supply line 4 on the downstream side of the flow meter 6 in the arrangement of the heating device 7 and the preheating tank 2 which do not secure a sufficient difference in level.

A portion of the upstream side supply line 4 from the liquid inlet side of the bottom portion of the heating device 7 to the branch connection portion to the liquid draining line 10, and the liquid draining line 10 are preferably arranged vertically so that the sulfuric acid solution in the tubular flow passage 70 of the heating device 7 can flow down by its own weight when the sulfuric acid solution is drained.

The collection container 40 is installed on a downstream end of the liquid draining line 10. The collection container 40 corresponds to a collection unit of the present invention. The sulfuric acid solution drained to the outside of the tubular flow passage 70 is collected via the part of the upstream side supply line 4 and the liquid draining line 10 into the collection container 40.

A description is given of such a configuration that the tubular flow passage 70 in the heating device 7 is arranged in the vertical direction, the upstream side supply line 4 is connected to the bottom side of the tubular flow passage 70, the downstream side supply line 8 is connected to the top side, and the upward flow of the sulfuric acid solution is formed in the tubular flow passage 70 as shown in FIG. 2 according to the first to fourth embodiments.

However, it is possible to employ such a configuration that a downward flow of the sulfuric acid solution is formed in the tubular flow passage 70 in place of the configuration for forming the upward flow. The upstream side supply line 4 is connected to the top side of the tubular flow passage 70, and the downstream side supply line 8 is connected to the bottom side in this case. Moreover, the liquid draining line 10 branches and is connected to the downstream side supply line 8 connected to the bottom side of the tubular flow passage 70. Moreover, the atmosphere opening line 12 branches and is connected to the upstream side supply line 4 connected to the top side of the tubular flow passage 70. As a result, the sulfuric acid solution in the tubular flow passage 70 can be caused to flow down by its own weight, and is drained to the outside of the tubular flow passage 70 also in such a configuration that the downward stream of the sulfuric acid solution is formed in the tubular flow passage 70. It should be noted that bubbles can reside in case of the downward flow, and the configuration for forming the upward steam is thus preferably used for a safer embodiment.

Though a description is given of the embodiments of the present invention, the present invention is not limited to contents of the embodiments, and can be properly modified as long as the modification does not depart from the scope of the present invention.

EXAMPLE

Example

A sulfuric acid solution of 86% by mass in sulfuric acid concentration was flowed through the tubular flow passage 70 of the heating device 7 at a flow rate of 1.5 L/min to heat the sulfuric acid solution in the liquid heating apparatus shown in FIGS. 1 and 2. The inlet temperature of the heating device 7 was 50° C. and the outlet temperature was 180° C. An emergency stop button was depressed to stop the liquid heating apparatus when the sulfuric acid solution was being heated. The emergency stop button is not described in each of the embodiments, and is an instruction button to stop the apparatus in emergency. The emergency stop immediately stopped the heaters 72 and 73 and the air pump 5, and the valves 11 and 13 were brought from the closed state to the open state. The open operation of the valves 11 and 13 may be controlled by the control unit 14 depending on the determination as the defective liquid flow in the liquid heating apparatus in FIG. 1, or may be carried out upon the power interruption by the fail safe mechanisms to open the valves 11 and 13 in the liquid heating apparatus in FIG. 2.

When the valves 11 and 13 were opened, the sulfuric acid solution in the tubular flow passage 70 of the heating device 7 was immediately drained, and was collected in the preheating tank 2.

After the sulfuric acid solution in the tubular flow passage 70 had completely been drained, the outlet temperature of the heating device 7 rose to 200° C., though which was extremely in a short period. It is considered that this is caused by such a phenomenon that residual vapor and the air present in the heating device 7 were heated and expanded, and a part thereof rose to an installed position of the thermometer.

Then, the heating device 7 was cooled by radiation, an outer surface temperature of the quartz flow passage member constructing the tubular flow passage 70 decreased to a temperature equal to or less than 150° C., the supply of the sulfuric acid solution was resumed, the sulfuric acid solution passed through the tubular flow passage 70 of the heating device 7 without boiling, and the heating operation for the sulfuric acid solution could be resumed.

Comparative Example

The normal heating operation for a sulfuric acid solution of 90% by mass in sulfuric acid concentration was carried out in the liquid heating apparatus shown in FIG. 5.

It was assumed that the valves 11 and 13 were not provided, and the heater 72 and the air pump 5 were stopped while the valves 11 and 13 were maintained in the closed state. A part of the residual liquid abruptly boiled approximately 10 seconds after the stop, overheated vapor was then generated, and the outlet temperature of the heating device 7 reached 300° C. The temperature further rose, and when the temperature exceeded 350° C., a neighborhood of a joint constructed by a PFA tube provided at the outlet of the heating device 7 was eroded, and a sulfuric acid vapor spouted.

DESCRIPTION OF THE REFERENCE NUMERAL

2 preheating tank
3 atmosphere opening line
4 upstream side supply line
5 air pump
6 flow meter
7 heating device
9 thermometer
10 liquid draining line
11 valve
12 atmosphere opening line
13 valve
14 control unit
20 pressure gauge
31 valve
33 valve
40 collection container
70 tubular flow passage
71*a* inner tube wall
71*b* outer tube wall
72 heater
73 heater

The invention claimed is:

1. A liquid heating method for heating a liquid flowing in a heat receiving area of a heating liquid flow passage by means of a heater arranged outside the heating liquid flow passage while flowing the liquid in the heating liquid flow passage, wherein during the heating by the heater or when remaining heat in a portion other than the liquid, caused by the heating, and at least exceeding the boiling point of the liquid is left after the heater is stopped, the liquid heated by the heater or receiving the remaining heat at least in the heat receiving area is drained to the outside of the heating liquid flow passage before boiling in the heat receiving area in response to a defective liquid flow in the heating liquid flow passage.

2. The liquid heating method according to claim 1, wherein the defective liquid flow is a stop of the liquid flow, or a decrease in a flow rate to a value equal to or lower than a predetermined value during the liquid flow.

3. The liquid heating method according to claim 1, wherein a depth of the heating liquid flow passage with respect to the heater is equal to or less than 10 mm, and the liquid passes the heat receiving area in 0.5 to 10 seconds by the liquid flow.

4. The liquid heating method according to claim 1, wherein the liquid is a sulfuric acid solution having 65 to 96% by mass in sulfuric acid concentration, and the heater heats the sulfuric acid solution to 140 to 220.

5. The liquid heating method according to claim 1, the heating liquid flow passage is arranged vertically, and in case of the defective liquid flow in the heating liquid flow passage an upper side of the heating liquid flow passage is opened to the atmosphere pressure so that the liquid is drained from a lower side of the heating liquid flow passage to flow down by its own weight.

* * * * *